United States Patent [19]

Karkar et al.

[11] 3,829,797

[45] Aug. 13, 1974

[54] MODULATOR AND METHOD

[75] Inventors: Edward M. Karkar, San Francisco; Nicolas Kovalevski, Menlo Park, both of Calif.

[73] Assignee: Karkar Electronics, Inc., San Francisco, Calif.

[22] Filed: July 23, 1973

[21] Appl. No.: 381,490

Related U.S. Application Data

[63] Continuation of Ser. No. 248,953, May 1, 1972, abandoned.

[52] U.S. Cl. ............... 332/43 B, 307/251, 307/264, 332/31 T, 332/48

[51] Int. Cl. ........................... H03c 1/54, H03c 1/38

[58] Field of Search ............ 332/31 T, 43 B, 48, 47, 332/44; 307/251 R, 264, 237; 325/450, 446

[56] References Cited

UNITED STATES PATENTS

| | | | |
|---|---|---|---|
| 3,281,718 | 10/1966 | Weberg | 332/31 T |
| 3,383,601 | 5/1968 | Squires | 332/43 B |
| 3,397,353 | 8/1968 | Hitt et al. | 307/251 X |
| 3,577,206 | 4/1969 | Ferrell | 332/43 B |
| 3,646,364 | 2/1972 | Kaminski | 307/251 |
| 3,668,561 | 6/1972 | Kruba et al. | 332/31 T |
| 3,727,078 | 4/1973 | Wollesen | 332/44 X |

*Primary Examiner*—Alfred L. Brody
*Attorney, Agent, or Firm*—Flehr, Hohbach, Test, Albritton & Herbert

[57] ABSTRACT

An amplitude modulator using an FET, or MOSFET and a coupling and phase splitting device capable of accepting both single ended and balanced inputs (like for example, a differential amplifier or a center tapped choke coil, or a transformer). The source and drain terminals are connected to the differential inputs (outputs) of the device, and the signal to the single ended input of the device. The carrier is applied to the gate terminal of the FET or MOSFET. The switching action of the device is equally efficient for both single ended and differential inputs (outputs). However, the carrier leak voltage is being applied simultaneously to both terminals of the differential input and thus suppressed in the output by virtue of high suppression of longitudinal (common) mode pertinent to devices with differential inputs (outputs). Other modulators are disclosed including a double balanced modulator using two complimentary field effect transistors and a double balanced modulator using two field effect transistors of the same conductivity type.

5 Claims, 6 Drawing Figures

MODULATOR AND METHOD

This is a continuation of application Ser. No. 248,953 filed May 1, 1972, now abandoned.

BACKGROUND OF THE INVENTION

A modulator is a device or circuit by means of which a signal wave is impressed upon a higher frequency periodic wave known as a carrier. The process is called modulation. A modulator may vary the amplitude, frequency or phase of the carrier wave. Modulation is frequently used in communication systems and in instrumentation for translating frequency components of a signal from an assigned band of frequencies into another portion of the frequencies spectrum.

An amplitude modulator varies the amplitude of the carrier wave in accordance with the modulating signal wave. The envelope of the carrier wave then has the same wave form as the modulating signal wave if the modulation is distortionless. There are many ways to accomplish amplitude modulation, but in all cases a nonlinear element or device must be employed since linear processes cannot yield frequency components in the output that are different from those already existing in the input. As an example, in communication, modulation makes frequency division multiplexing possible by assigning each information channel (speech, data, etc.) to a portion of the transmission frequency spectrum. In order to preserve a true processing of information, the relative strength and phase of all components representing the signal must be preserved during translation or transmission of the signal.

Ideally, a modulated wave can be considered a product of the signal and carrier wave. Assuming the signal and carrier wave to be sinusoidal waves, then the modulated wave can be represented as:

(1) $M(t)=\cos \omega_c t \cos \omega_s t$ where $c$ and $s$ respectively indicate the carrier and signal waves. This equation (1) can be expressed as:

(2) $M(t)=\frac{1}{2} [\cos (\omega_C+\omega_s)t+\cos (\omega_c-\omega_s)t]$.

Thus no component of the original signal or carrier waves or frequencies exist. What results is a side band on each side of the carrier frequency $\omega_c$ spaced $\omega_s$ away.

In practice it is often difficult to produce the multiplication process discussed above, so that a square wave carrier which can be easily generated is often used. With a square wave carrier the modulator becomes basically a switch that interrupts the signal periodically at the carrier frequency rate. Fourier analysis of a square wave demonstrates that the square wave has only odd harmonics of the fundamental frequency in addition to a DC component in some situations. Thus the modulated wave has frequency components spaced $\omega_s$ on either side of the odd harmonics of the fundamental carrier frequency; that is, $(2N-1)f_c \pm f_s$ in addition to $f_s$.

In actual modulators using a square wave carrier, switching is not ideal, but takes some finite time. Thus frequency components, $f_{N,M}=Nf_c \pm Mf_s$ are generated in the output where N is not only odd but may be even, and where M is not only equal to unity but may also be equal to 2, 3, etc., as discussed above. Usually only the component $f_{1,1}$ or $f_{1,-1}$ is desired. Therefore, the other components appearing in the output must be eliminated because they can impair the recovery of the original signal (distortion, cross-talk, etc.).

The prior art includes some examples of modulators in which attempts to limit carrier leak have been made. One such example is the Bowan modulator, which is described in *Communication Systems and Techniques*, by M. Schwartz, W. Bennet and S. Stein, McGraw-Hill Book, Inc., 1966, page 178. The Bowan modulator is a shunt modulator in which a carrier is applied to one diagonal of a bridge consisting of four diodes or four transistors with the signal wave applied to the other diagonal. During one half of the carrier cycle all the diodes are reverse biased, attenuating the signal very little. On the next half of the carrier cycle all the diodes are forward biased, practically short-circuiting the shunt path of the circuit and thus hindering the transmission of the signal. The suppression of carrier leak depends upon the equality of the instantaneous dynamic resistance of all four diodes. There would be no carrier leak if the equality would hold for all portions of the carrier cycle. This cannot be practically achieved, and can only be approximated by the careful selection and/or manufacturing of matched diodes.

One non-linear device which has been found to be particularly useful as a modulator is a field effect transistor (FET or MOSFET). A particular advantage of FET's as modulators is their high gate impedance, which allows a large number of modulators to be operated from the same carrier supply without interference. FET's also have low carrier power consumption.

FET's have been used in prior art modulators but such modulators have had limitations. One problem has been that of carrier leak. The control terminal where the carrier wave $f_c$ (and possibly harmonics of $f_c$ for the case of a square carrier wave) is applied cannot be totally isolated from the terminals which are being switched. Even in MOSFET devices there is stray capacity between all terminals of the device. Thus, for example, stray capacitances exist between the gate and source electrode and between the gate and drain electrode of the devices. The result of this stray capacitance is leaking of the carrier wave $f_c$ and its multiples into the output of the modulator. This process is referred to as carrier leak and results in undesirable frequency components $Nf_c$ in the output. Since the carrier leak is a function of the stray capacitance, it increases with frequency, rendering previous FET or MOSFET modulators unacceptable at high frequencies.

With a square wave carrier, there is also the problem of signal distortion due to imperfect switching. That is, the switch of FET is actually never completely open so that it would have infinite impedance, nor is it ever completely closed where it would have zero impedance. Rather, the switch impedance changes from a very high to very low values of impedance ($r_s$). Moreover, the transition from $r_s$ low to $r_s$ high is not made instantaneously, but rather made within a finite time which is a small fraction of the carrier. In this transition period the impedance $r_s$ is not a linear function of time. This departure of behaviour of the actual switch impedance from an ideal one produces frequency components $f_{N,M}$ ($M$=2, 3, etc.) in the output which are undesirable.

SUMMARY OF THE INVENTION AND OBJECTS

Accordingly, it is an object of this invention to provide an improved modulator for overcoming the above-described disadvantages.

It is a more specific object of this invention to provide a modulator in which carrier leak components are minimized in the output.

It is another object of this invention to provide a modulator having minimum carrier leak at high frequencies.

It is another object of this invention to provide a modulator utilizing a square wave carrier wherein the presence of even order products ($f_c \pm 2Nf_s$) of the square carrier wave components due to less than ideal switching of the modulator are minimized in the output.

Briefly, in accordance with one embodiment of the invention, there is provided an amplitude modulator including a field effect transistor having source, drain and gate electrodes and having inherent parasitic capacitances between the gate and source electrodes and the gate and drain electrodes. The source and drain terminals are connected to the differential inputs (outputs) of a device capable of accepting both single ended and balanced inputs. The signal is then applied to the single ended input of the device and the carrier is applied to the gate of the field effect transistor. The carrier leak into the modulated wave output due to the parasitic capacitances is minimized because the carrier leak due to the two inherent parasitic capacitances are substantially equal in magnitude and opposite in phase at the output terminals so that they cancel each other.

DESCRIPTION OF THE PREFERRED EMBODIMENTS

Figure 1:
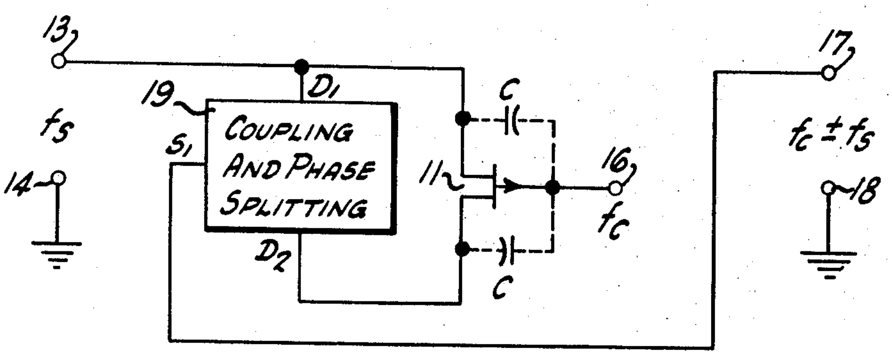
FIG. 1 is a generalized circuit schematic of a balanced modulator in accordance with this invention utilizing an FET.

Turning now to a consideration of the drawings, FIG. 1 shows a generalized schematic diagram of a modulator in accordance with this invention. The modulator of FIG. 1 includes a field effect transistor 11 having gate, source and drain electrodes. A signal wave $f_s$ is introduced to the modulator at a pair of input terminals 13 and 14. A pair of output terminals 17 and 18 are also provided. A carrier wave, $f_c$, is applied to a terminal 16 which is connected to the gate of the field effect transistor 11. A coupling and phase splitting device 19 is provided which has a pair of differential inputs (outputs) D1 and D2 and has a single ended input S1. The source and drain terminals of field effect transistor 11 are connected to the differential inputs (outputs) D1 and D2. The field effect transistor 11 has parasitic capacitances between its gate and source electrode and between its gate and drain electrode. These capacitances are labeled as C in FIG. 1 and are shown in dotted lines. Suitable biasing (not shown) is also provided for the field effect transistor 11.

In operation, the device 19 acts as a coupler and phase splitter and sums the difference between the differential inputs D1 and D2 and applies the difference to S1. The carrier leaks to the drain and source of the field effect transistor 11 due to the parasitic capacitances C are respectively applied to the two differential inputs D1 and D2 of coupling and phase splitting device 19. Since the two capacitances C are approximately equal, the carrier leaks due to them are approximately equal, thus canceling each other in the coupling and phase splitting device 19, so that they do not appear at the output terminals 17 and 18. When the field effect transistor 11 is open or not conducting, the only input to the differential input device 19 is at D1 which is coupled through to S1 so that the signal on terminals 13 and 14 is coupled through to the output. When, however, the field effect transistor 11 is closed or conducting, the signal on terminal 13 for example is applied simultaneously on both differential inputs D1 and D2 so that no signal appears at S1. Thus no signal appears at the output terminals 17 and 18.

Figure 2:
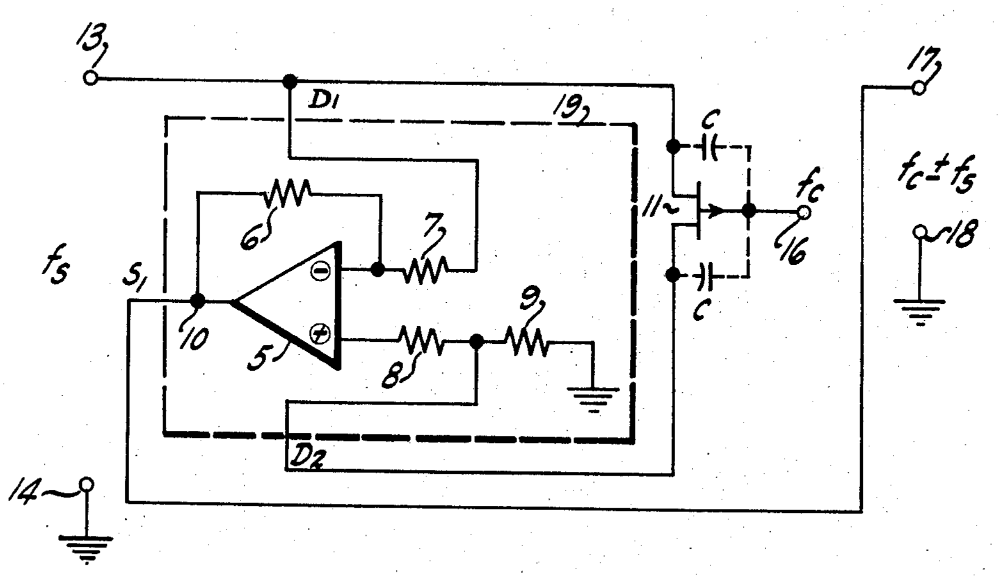
FIG. 2 is a schematic diagram of one embodiment of the balanced modulator of this invention which utilizes a differential amplifier.

FIG. 2 is a schematic diagram of one specific embodiment of the invention in which an operational amplifier is utilized for coupling and phase splitting. The same reference numerals have been utilized in FIG. 2 as were used in FIG. 1 for designating the field effect transistor and the various input and output terminals. The coupling and phase splitting device 19 in FIG. 2 includes an operational amplifier 5 having + and − differential inputs and an output terminal labeled 10. Suitable feedback, limiting and biasing resistors 6, 7, 8 and 9 are provided in a manner known to those skilled in the art. The carrier leaks to the drain and source of field effect transistor 11 are respectively applied to the + and − differential inputs of operational amplifier 5 so that they cancel and do not appear at its output terminal 10. The input signal $f_s$ is applied to one of the differential inputs of the operational amplifier 5 (the − input for example). When the field effect transistor 11 is open or not conducting, there is an input to only this one of the differential inputs so that the signal is coupled through to the output. When the field effect transistor is closed or conducting on to the other hand, the signal $f_s$ is applied simultaneously to both the differential inputs of operational amplifier 5 so that they cancel at its output terminal 10 and do not appear at output terminals 17 and 18. Thus the signal wave $f_s$ is modulated by the carrier wave $f_c$ applied to the gate of field effect transistor and through use of a coupling and phase splitting arrangement carrier leaks are eliminated from the output.

Harmonic distortion as well as carrier leak is also minimized in the output by the symmetrical action of the modulating circuit. That is, these components $f_c \pm Nf_s$ ($N$=1,2,3, etc.) are also suppressed to a very high degree.

Figure 3:
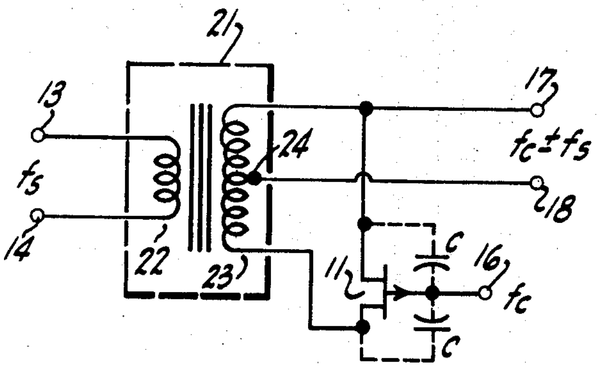
FIG. 3 is a schematic diagram of one embodiment of the balanced modulator according to this invention which utilizes a center-tapped transformer for eliminating carrier leak components.

FIG. 3 shows an embodiment of a modulator in accordance with this invention in which symmetrical action for cancelling carrier leak and harmonic distortion components is achieved through the use of a center-tapped transformer. The field effect transistor and various terminals in FIG. 3 are given the same reference numerals as in FIGS. 1 and 2. Thus the modulator of FIG. 3 has a pair of input terminals 13 and 14, a pair of output terminals 17 and 18, a field effect transistor 11 having gate source and drain electrodes, and parasitic capacitances C shown between the gate and source electrodes of field effect transistor 11 and the gate and drain electrodes of the field effect transistor 11. A terminal 16 is provided for applying a carrier wave $f_c$ to the gate of the field effect transistor 11. In the modulator of FIG. 2 coupling of the signal wave $f_s$ across the source and drain electrodes of field effect transistor 11 is achieved through use of a transformer 21 having a primary winding 22 and a secondary winding 23. The secondary winding 23 has a center tap 24.

As described before in connection with FIG. 1, in the modulator of FIG. 3 the carrier leak due to the parasitic capacitances C associated with the field effect transistor 11 is coupled approximately equally to both the source and the drain electrodes of the field effect transistor 11. Since the output terminal 18 is connected to the center tap 24 of transformer secondary 23, the carrier leaks due to the two parasitic capacitances C cancel each other out and do not appear at the output terminals 17 and 18.

Besides suppressing carrier leak, the symmetrical action of the center-tapped transformer 21 also suppresses to a high degree even order products which might be due for example, to the fact that the field effect transistor 11 is less than an ideal switch. In tests using the actual circuit of FIG. 2 these even harmonics were better than 72 dB down utilizing carrier frequencies of 128 KHz and 196 KHz. In experiments using these two carrier frequencies it has been found that the circuitry of FIG. 3 produces a modulated signal at output terminals 17 and 18 in which the second order products, which as known to those skilled in the art are the most troublesome, are 75 dB down at the output. This compares to a simple FET series or shunt modulator without any symmetry for cancelling carrier leak and even harmonics, of 30 dB down at the output for second order products. Thus, it can be seen that the present invention provides a highly improved modulator using an FET in which carrier leak and even harmonics due to less than ideal switching are minimized at the output so that the modulator is particularly useful at relatively high carrier frequencies.

Figure 4:
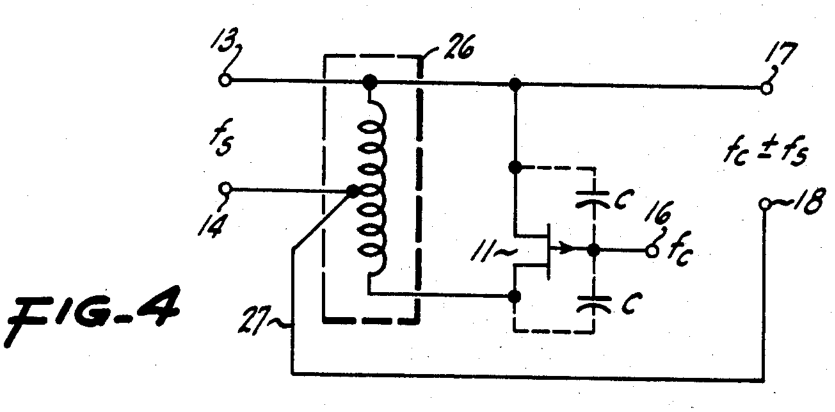
FIG. 4 is similar to FIG. 2 but shows a balanced modulator with an unsymmetrically applied signal wave and which utilizes a center-tapped choke or coil for eliminating carrier leak components.

FIG. 4 is similar to FIG. 3 and again identical reference numerals are used to refer to identical elements in the modulator of FIG. 4. Thus the modulator of FIG. 4 includes a pair of input terminals 13 and 14 to which a signal wave $f_s$ is applied and a pair of output terminals 17 and 18 at which the modulated wave appears. A field effect transistor 11 is provided having source drain and gate electrodes and including a pair of parasitic capacitances C between the source and gate electrodes and the drain and gate electrodes, respectively. A terminal 16 is provided connected to the gate of the field effect transistor 11 and the carrier wave $f_c$ is adapted to be applied to terminal 16. The signal wave $f_s$ is applied across the source and drain electrode of the field effect transistor 11 by means of a choke coil 26 having a center tap 27. The center tap 27 is connected to the output terminal 18. The modulator of FIG. 4 thus functions in a manner similar to the modulator of FIG. 3 in that at the center tap 27 the carrier leaks due to the two capacitances C cancel each other and thus do not appear at the output terminals 17 and 18.

Figure 5:
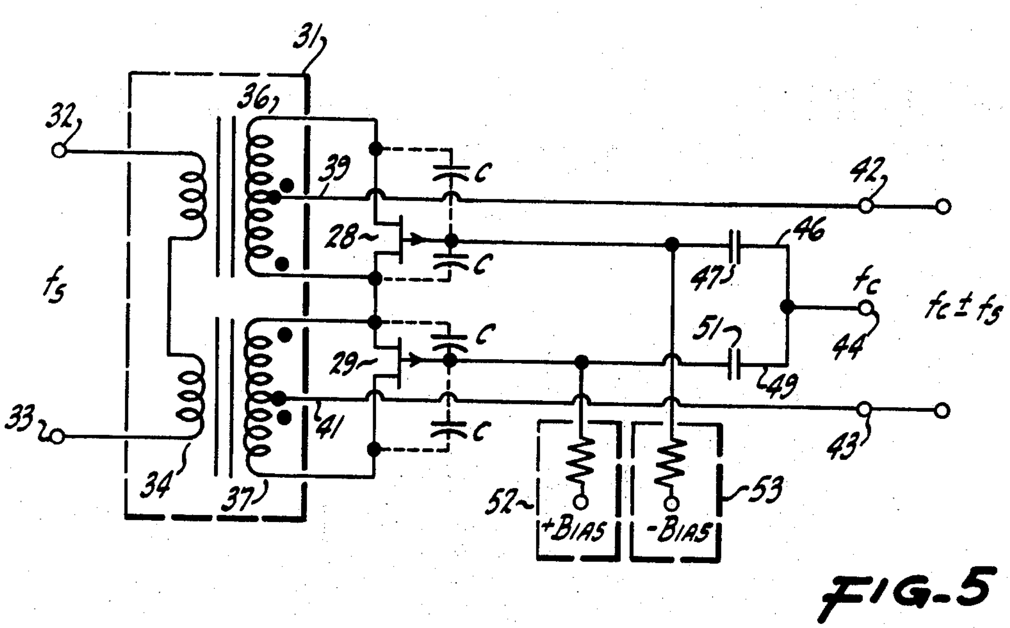
FIG. 5 is a circuit schematic of a double balanced modulator in accordance with this invention which utilizes complimentary FET's and utilizes two center-tapped transformers for eliminating carrier leak components.

The basic improved modulator depicted in FIGS. 1–4 represents a simple balanced modulator of high quality and performance. This type of modulator suppresses the carrier wave but passes the original signal wave $f_s$. An ideal double balanced modulator provides in its output exactly the same spectrum as the above described single balanced modulator except that it also suppresses the original signal component $f_s$. Using a modulator such as shown in FIGS. 1 through 4 as half of a total circuit, a novel double balanced modulator of high quality performance is obtained. Referring now to FIG. 5 there is shown one embodiment of such a double balanced modulator. The modulator of FIG. 5 includes two of the basic modulators of FIGS. 1 through 4 connected in series. One of the modulators utilizes a P channel FET 28 and the other of the modulators utilizes an N channel FET 29. A transformer 31 is provided for coupling the signal wave $f_s$ at input terminals 32 and 33 to the FET's 28 and 29. The transformer 31 includes a primary winding 34 and secondary windings 36 and 37. The polarities of these two secondary windings are shown by the dots in FIG. 5. Secondary winding 36 includes a center tap 39 and secondary winding 37 includes a center tap 41. The center tap 39 is connected to an output terminal 42 and the center tap 41 is connected to an output terminal 43. The double balanced modulator arrangement of FIG. 5 requires a single ended carrier wave drive. Thus the carrier wave at terminal 44 is split into a path 46 which is coupled by a capacitor 47 to the gate of P type FET 28 and a path 49 which is coupled by a capacitor 51 into the gate of the N type FET 29. The FET's gates must be properly DC biased to arrange so that for the positive peak of the carrier wave the N type FET 29 is conducting (zero gate voltage with respect to source) and the P type is open (positive gate with respect to source). In this situation the modulated wave is transmitted to the output terminals through the circuit containing the open P type FET 28, with the N type FET 29 being short-circuited. During the next half carrier cycle the opposite takes place, i.e., transmission through the N type FET circuit 29. The polarity of the transformer 31, as shown by the dots applied to the windings thereof in FIG. 5, is chosen such that the polarity is then opposite to that which existed when the P type FET was transmitting. This change of polarity during each half of the carrier cycle duplicates the action of other known double ended modulators. The modulator of FIG. 5, however, in accordance with the principles discussed in connection with FIGS. 1 through 4, maintains high suppression of the carrier leak $f_c$ and of the even order products ($f_c \pm 2Nf_s$) less than ideal switching. The suppression of $f_s$ in FIG. 5 is achieved by proper biasing such as by biasing circuits 52 and 53 to insure that transmission through the P type FET and the N type FET are equal in strength or amplitude.

Figure 6:
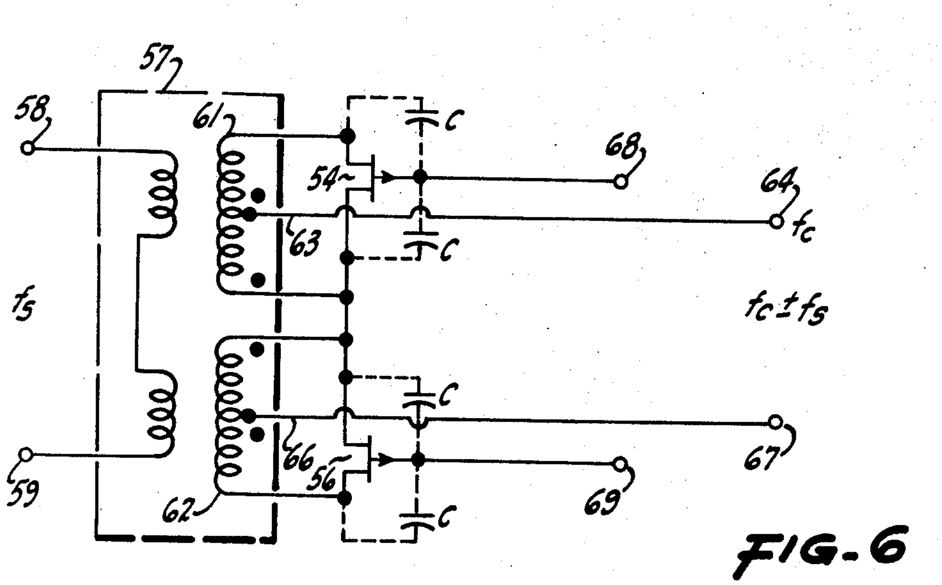
FIG. 6 is also a schematic diagram of a double balanced modulator but one which utilizes two FET's of the same conductivity type.

The modulator shown schematically in FIG. 6 is a double balanced modulator in which the two halves of the modulator are identical. Thus the modulator of FIG. 6 includes two N type FET's 54 and 56 each having source drain and gate electrodes. Alternatively, of course, two P type FET's could be utilized. A transformer 57 is provided for coupling a signal wave $f_s$ at input terminals 58 and 59 to the FET's . The transformer 57 has two secondary windings 61 and 62 with the secondary windings 61 being connected across the source and drain of FET 54 and the secondary winding 62 being connected across the source and drain of the FET 56. The secondary winding 61 has a center tap 63 which is connected to an output terminal 64 and the secondary winding 62 has a center tap 66 which is connected to an output terminal 67. A terminal 68 is connected to the gate of FET 54 and a terminal 69 is connected to the gate of FET 56. The double balanced modulator of FIG. 6 requires a balanced carrier input to the terminals 68 and 69. Thus a carrier $f_c$ is applied to terminal 68 and a carrier $f_c$ with 180° phase shift is applied to the terminal 69. The 180° phase shift of the carrier can be obtained by using any of the known circuits such as commercially available flip-flops. The circuit of FIG. 6 operates in essentially the same manner as the circuit of FIG. 5 and does not require any special bias adjustment for equalizing the two FET's. That is, each of the two halves of the circuit transmit alternatively during each half of the carrier cycle.

Thus the double balance circuit of FIGS. 5 and 6 in addition to providing suppression of carrier leak and even order products due to less than ideal switching in a manner similar to that discussed above in connection with the modulators of FIGS. 1 through 3, also due to being double balanced provide suppression of the signal wave component $f_s$ at the output.

It should also be pointed out that the modulators in accordance with this invention are completely reversible while still maintaining suppression of carrier leak and even harmonics due to less than ideal switching. That is, for all the embodiments shown in FIGS. 1 through 6 the signal wave may be applied to what has been nominally referred to as the output terminals with the modulated wave appearing at what has been nominally referred to as the input terminals.

We claim:

1. A double balanced amplitude modulator for changing the amplitude of a carrier wave in accordance with a signal wave to form a modulated wave comprising a pair of field effect transistors each having source drain and gate electrodes and each having inherent parasitic capacitances between their gate and source electrodes and gate and drain electrodes, respectively, means for applying a carrier wave to said gates of said field effect transistors, a pair of input terminals adapted to be connected to a signal wave source, coupling means for coupling the signal wave at the pair of input terminals across the source and drain electrodes of both said field effect transistors, said coupling means comprising a transformer having a primary winding and a pair of secondary windings, said primary winding connected to said input terminals, one of said secondary windings connected across the source and drain electrodes of one of said field effect transistors and the other of said secondary windings connected across the source and drain electrodes of the other of said field effect transistors, both of said secondary windings having center taps, a pair of output terminals, means connecting the center tap of one of said secondary windings to one of said output terminals and means connecting the center tap of the other of said secondary windings to the other of said output terminals whereby carrier leaks due to parasitic capacitances between the source and gate and the drain and gate electrodes of each of said field effect transistors cancel each other at the respective center taps of said pair of secondary windings.

2. An amplitude modulator in accordance with claim 1 wherein said pair of field effect transistors are of the same conductivity type and wherein the carrier wave applied to the gate of one of said field effect transistors is shifted 180° in phase with respect to the carrier wave applied to the gate electrode of the other of said field effect transistors.

3. An amplitude modulator in accordance with claim 1 wherein said pair of field effect transistors are complementary.

4. An amplitude modulator in accordance with claim 1 which is reversible whereby the signal wave can be applied to either the input or the output terminals which results in the modulated wave appearing at either the output or input terminals, respectively.

5. An amplitude modulator in accordance with claim 1 wherein the carrier wave is a square wave and wherein said pair of field effect transistors each require a finite time for switching in response to the square carrier wave so that even harmonics of the fundamental frequency of the carrier wave are produced and wherein said even harmonics appear at both the source and drain electrodes of both of said pair of field effect transistors, and wherein said center taps cause half of the even harmonics to be phase shifted to cancel out the other half of the even harmonics.

* * * * *